United States Patent [19]

Bujese

[11] Patent Number: 4,763,157
[45] Date of Patent: Aug. 9, 1988

[54] TRANSFER ROLLER

[75] Inventor: David P. Bujese, Butler, N.J.

[73] Assignee: Olin Hunt Specialty Products Inc., Palisades Park, N.J.

[21] Appl. No.: 91,617

[22] Filed: Aug. 31, 1987

[51] Int. Cl.[4] .................................. G03G 15/16
[52] U.S. Cl. .................... 355/3 TR; 355/14 TR
[58] Field of Search .......... 355/3 TR, 14 TR, 3 R, 355/3 SH; 430/126, 119; 101/DIG. 13

[56] References Cited

U.S. PATENT DOCUMENTS

| T869,004 | 12/1969 | Culhane | 96/1.4 |
|---|---|---|---|
| 3,950,095 | 4/1976 | Bouygues et al. | 355/72 |
| 4,116,557 | 9/1978 | Kushima et al. | 355/3 TR |
| 4,226,526 | 10/1980 | Spence-Bate et al. | 355/53 |
| 4,245,555 | 1/1981 | Alston | 355/3 TR |
| 4,346,983 | 8/1982 | Jeromin et al. | 355/3 TR |
| 4,437,754 | 3/1984 | Idstein | 355/3 TR |
| 4,478,924 | 10/1984 | Moraw et al. | 430/136 |

Primary Examiner—R. L. Moses
Attorney, Agent, or Firm—Ralph D'Alessandro

[57] ABSTRACT

Apparatus for the electrostatic transfer of a developed latent image from a master to a conductive receiving surface is provided and utilizes a transfer roller that traverses the carrier web to bring the master that is attached to the web adjacent to, but not in contact with, the conductive receiving surface.

20 Claims, 3 Drawing Sheets

TRANSFER ROLLER

BACKGROUND OF THE INVENTION

This invention relates generally to apparatus for the electrostatic transfer of a developed image from a master to a receiving surface. More specifically, it pertains to the movable transfer means that contacts and traverses a carrier means which supports the master to effect the electrostatic transfer.

The permanent master and the transfer means are used repeatedly to produce high resolution and high quality images on receiving surfaces, such as printed circuit boards. Receiving surfaces, such as printed circuit boards, have traditionally been produced by individual laminating, exposing, developing, etching and stripping processes where dry film photoresist has been used to produce the conductive wiring patterns. Heretofore, there has been no method or apparatus available to produce a plurality of copies of conductive wiring patterns from a single master copy of the desired wiring pattern utilizing a dry film resist and photoimaging. There are many factors which prevented this type of a system from being employed to manufacture multiple copies from a single master.

Where liquid toner was employed, it was extremely difficult to attempt to clean excess toner or prevent the buildup of excess toner from the master. The ability to obtain a uniform and full width image over a large area, such as a 24 inch by 24 inch surface, was severely restricted. Trapped air or liquid solvent can frequently cause voids in the electrostatically transferred developed image. Where electrostatics were used to effect the transfer, the ability to separate the master surface and the receiving surface was critical and extremely difficult because of the electrostatic forces involved. Lastly, the availability of reliable and durable equipment to effect repeated transfers of the developed image on a master to a receiving surface was severely limited.

These problems are solved in the design of the apparatus of the present invention by providing transfer means that contacts the carrier of the master to effect an electrostatic transfer of a developed image to a receiving substrate by traversing the carrier means for a distance equal to at least the length of the master.

SUMMARY OF THE INVENTION

It is an object of the present invention to provide transfer roller means that are cooperative with the carrier means to move the master with the developed latent image adjacent to the conductive receiving surface to effect the electrostatic transfer of the developed image.

It is another object of the present invention to provide transfer means to maintain the predetermined angular ranges for the leading and trailing angles of the carrier means with respect to the conductive receiving surface to ensure discrete point of contact transfer of the developed image on the master to the conductive receiving surface.

It is a feature of the present invention that the transfer roller means traverse over the carrier web means to which the master is attached to position the master adjacent to the conductive receiving substrate to electrostatically transfer the developed image on the master across the finite liquid-filled gap to the receiving substrate.

It is another feature of the present invention that the angle of the carrier web means and the attached master is controlled with respect to the conductive receiving substrate to obtain the full width and high quality electrostatically transfer image on the conductive receiving surface.

It is yet another feature of the present invention that the carrier web means is kept uniformly tensioned as the transfer roller means traverses the carrier web means to achieve the high quality and high resolution image transfer to the conductive receiving surface.

It is an advantage of the present invention that discrete point transfer of the developed image to the conductive receiving surface occurs.

It is another advantage of the present invention that entrapped air and excessive insulating solvent liquid is avoided between the carrier web means and the conductive receiving surface so that incomplete transfer of the image and creation of a standing wave of entrapped material is avoided.

It is yet another advantage of the present invention that there is no rippling of the carrier web means.

It is still another advantage of the present invention that the carrier web means with the master attached and the conductive receiving surface are separate and are in close proximity only at the discrete points of transfer in the transfer window to avoid excessive electrostatic force that could pull the master and the conductive receiving surface into contact.

It is still another advantage of the present invention that the leading angle of the carrier web means with respect to the conductive receiving surface is large enough to prevent the electrostatic force on the conductive receiving surface from pulling the master and the conductive receiving surface into contact and to open up the carrier web means, and still small enough to provide a good transfer window and not to overstress the carrier web means and the mechanics of the apparatus to permit repeated transfers to be accomplished.

These and other objects, features and advantages are obtained by use of a master attached to a carrier web means which tranfers a developed image to a conductive receiving surface via the use of transfer roller means contactable with the carrier web means to move the master adjacent to but not into contact with the conductive receiving surface to effect the electrostatic transfer of the developed image by having the transfer roller means traverse a distance at least equal to the length of the master. The carrier web means is retained by tensioning roller means which are positioned so the transfer roller means is intermediate the tensioning roller means and the retention roller means to thereby cause the carrier web means to form a leading angle and a trailing angle with the conductive receiving surface as the transfer roller means traverses the carrier web means during the electrostatic transfer.

BRIEF DESCRIPTION OF THE DRAWINGS

The objects, features and advantages of the present invention will become apparent upon consideration of the following detailed disclosure of the invention, especially when it is taken in conjunction with the accompanying drawings wherein.

DETAILED DESCRIPTION OF THE PREFERRED EMBODIMENT

Figure 1:
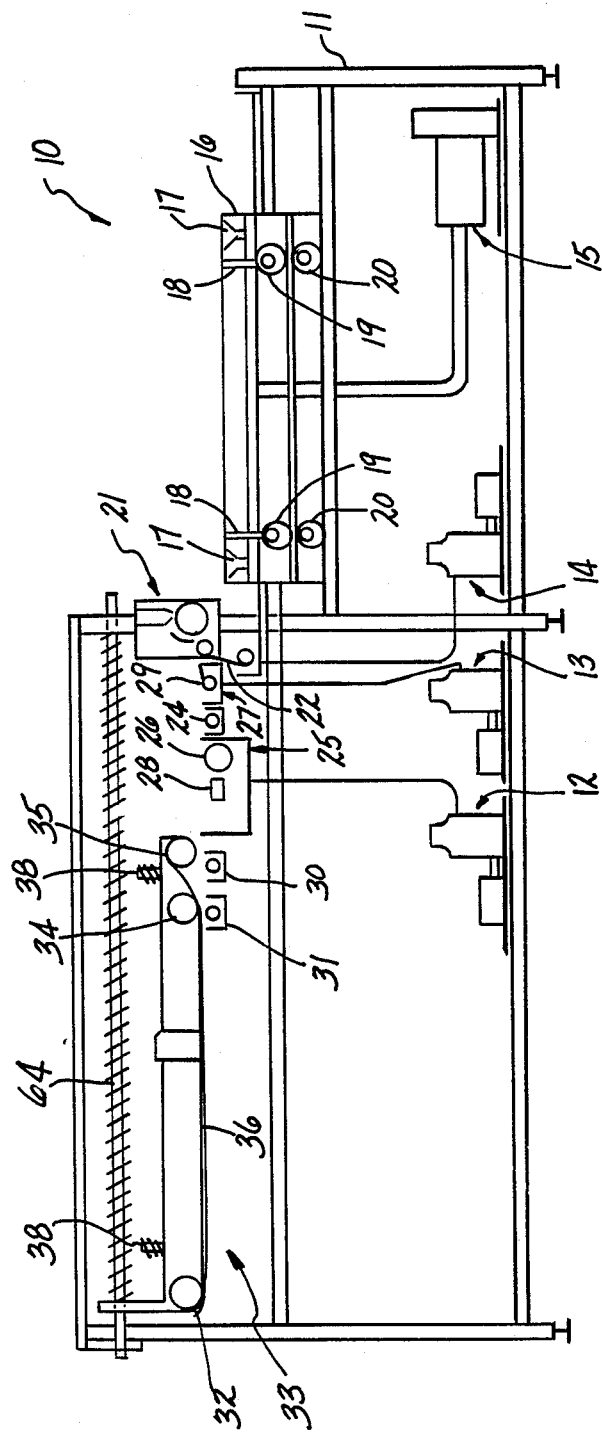
FIG. 1 is a side elevational view of the apparatus for transferring the electrostatically developed image from a master to a conductive receiving surface.

FIG. 1 shows a side elevational diagrammatic illustration of the electrostatic imaging apparatus, indicated generally by the numeral 10. Apparatus 10 has a support frame 11 to which are mounted toner tank assembly 12, cleaning station tank and feed line assembly 13, non-polar insulating solvent tank assembly 14, and vacuum pump assembly 15. Each of the tank assemblies 12, 13 and 14 have appropriate hoses and pumps to either distribute the toner to the toning station 25 or the non-polar insulating solvent to the master cleaning station 27 and wicking station 21, respectively.

The permanent master is a multiple layered structure having a base layer of a suitable flexible and non-conductive plastic, such as a polyethylene terephthalate sold under the tradename Mylar ®, which is coated with an aluminum layer and a layer of photosensitive material, such as dry film or liquid photoresist. The permanent master is produced by exposing the desired pattern, such as through a mask, to actinic radiation. The exposed pattern on the electrostatically imageable surface of the master, once thus cross-linked, creates a persistent latent image. This latent image will hold an electrostatic charge when exposed to a charging apparatus, such as corona 31. The charged image attracts the toner particles of an appropriate toner when the master 40 with the image thereon is passed through toning station 25.

Figure 2:
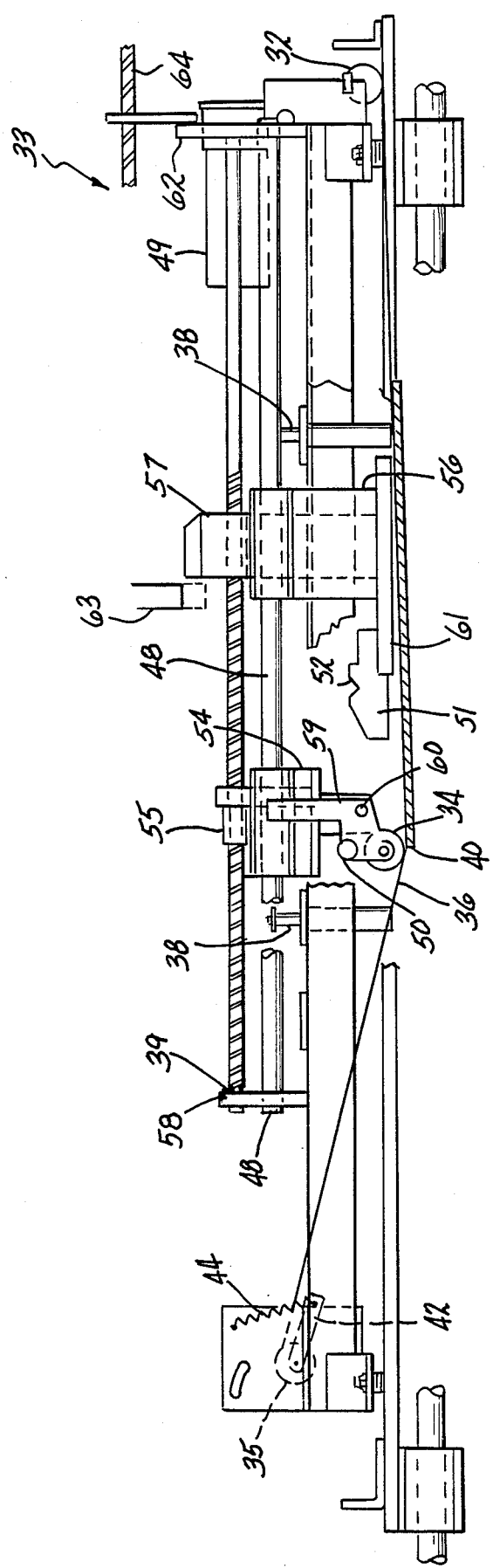
FIG. 2 is an enlarged side elevational view of the transfer roller means apparatus utilized to transfer the developed latent image from the master attached to the carrier web means to the conductive receiving surface.

The master, seen as 40 in FIG. 2, is placed on a stationary platen 16 of FIG. 1. Alignment pins 18 assure that the master 40 is properly positioned on the stationary platen 16 via the use of pin cams 19 and platen cams 20, or other appropriate apparatus. The master 40 is then picked up by the carrier web means 36 by having the transfer assembly, indicated generally by the numeral 33, move over the platen 16 by traversing the master transport rod 39 (see briefly FIG. 1). The transfer assembly 33 is aligned and registered to the master 40 and platen 16 by the engagement of pins 38 on the transfer assembly 33 with the pin receptacles 17.

An electrical charge is supplied to the carrier web means 36, which is formed from a flexible, non-conductive material having a conductive coating. Silver coated Mylar ® plastic has been successfully employed. The electrical charge is carried by the conductive coating and creates the electrostatic force which holds the master on the carrier web means 36. The transfer assembly 33 then returns to the start position shown in FIG. 1, carrying the master 40 with it.

Figure 3:
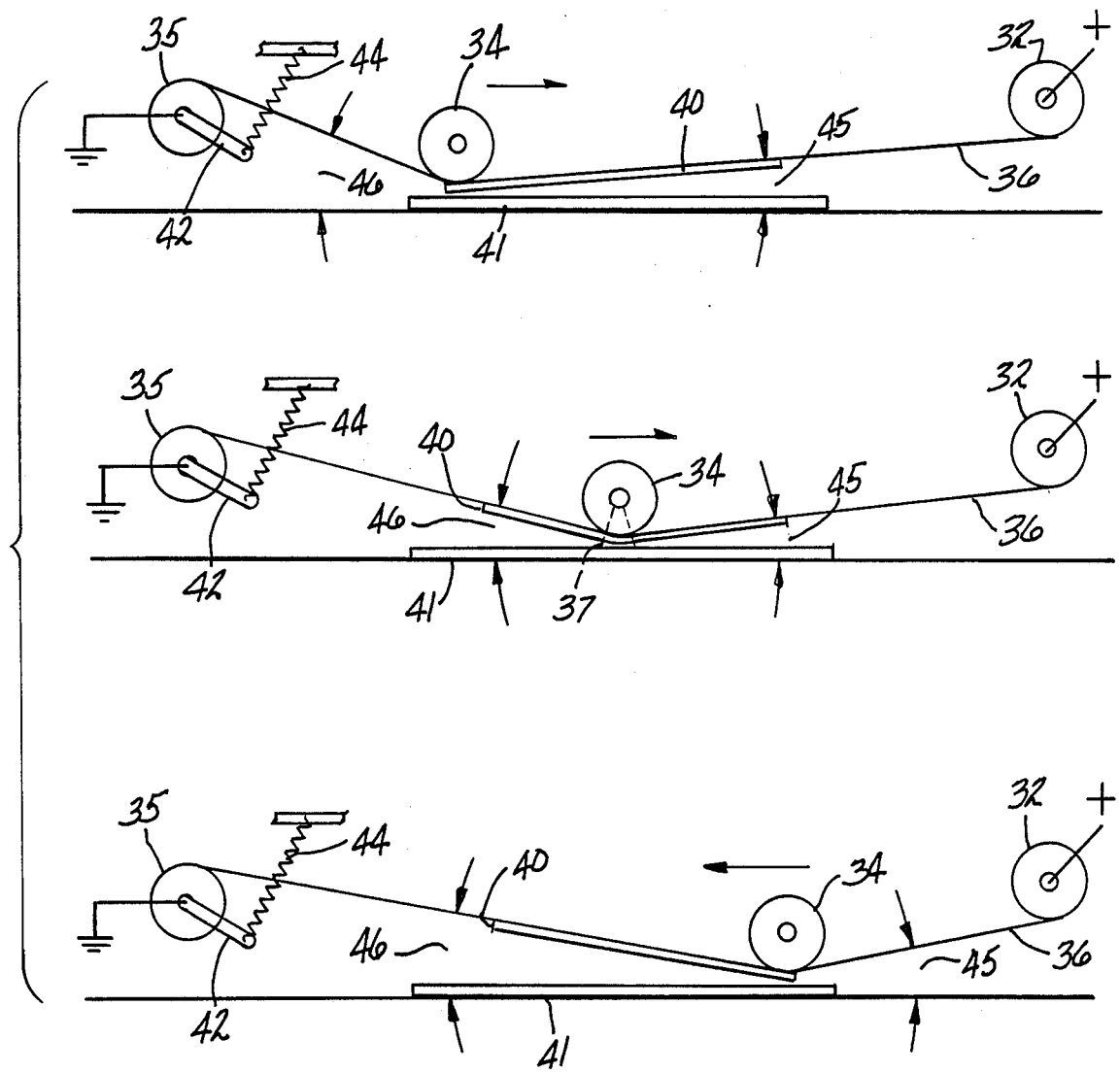
FIG. 3 is a sequential diagrammatic illustration of the transfer roller means as it traverses the carrier web means and the attached master to position the developed master adjacent to, but not in contact with, the conductive receiving surface.

A conductive receiving surface 41, such as a copper circuit board, which is preferably two-sided and is diagrammatically illustrated in FIG. 3, is placed on the platen 16 of FIG. 1 and is registered so it will be precisely aligned with the master 40 by the alignment pins 18 that are positioned by means of cams 19, or other appropriate apparatus. The position of the platen 16 can be controlled by any appropriate apparatus, such as cams 20, if necessary.

The transfer assembly 33, once the conductive receiving surface 41 is properly positioned on platen 16, carries the carrier web means 36 and the master 40 of FIGS. 2 and 3 toward the platen 16. The master 40 passes over the charging corona 31 of FIG. 1, which charges the persistent latent image on the master 40 and then passes over the toning station 25, which includes reversing roller 26 and development toner electrode 28, to develop the latent image. Excess solvent is removed from the area around the developed image by the reversing roller 26 in conjunction with the depressant corona 24, which removes the excessive non-polar insulating solvent from around the developed image before transfer. A web wiper 29, also shown in FIG. 1, is used to clean the master 40 as part of the cleaning station 27 after image transfer has occurred.

Wicking station 21 then applies a layer of liquid containing non-polar insulating solvent to the conductive receiving surface 41 of FIG. 3. Gap spacing and charging strips 22, preferably about 5 mils thick and formed of Mylar ® plastic coated with aluminum on the bottom surface, are placed along opposing sides of the conductive receiving surface 41 by dispensing apparatus (not shown) in the wicking station 21 as the transfer assembly 33 passes over the surface 41 (not shown) on the platen 16.

The transfer assembly 33 stops when the master 40 on the carrier web means 36 is positioned precisely over the conductive receiving surface 41 on the platen 16, so that the master 40 and the conductive receiving surface are coincident.

As best seen in the diagrammatic illustration in FIG. 3, the transfer assembly 33 has electrically grounded web tensioning roller means 35 mounted on an idler arm 42 that is movable by means of the spring 44 to cause the roller means 35 to turn about a suitable support, such as a bearing (not shown), to maintain the proper tension on the carrier web means 36. Once properly positioned, the transfer roller means 34 contacts the back or upper side of the carrier web means 36 and traverses a distance equal to at least the length of the master 40 to bring the master adjacent to, but not in contact with, the conductive receiving surface 41 at discrete points along the entire length of the master. Web retention roller means 32 applies the high voltage charge, varying from about 200 to about 3,000 volts dependent upon the master, to the silver surface of the carrier web means 36 to pick up and retain the master 40 on the carrier web means 36. Web retention roller means 32 combines with the tensioning roller means 35 and the transfer roller means 34 to permit the transfer roller means 34 to smooth out the carrier web means 36 and the master 40 to obtain a smooth, continuous surface that is free of ripples.

As is best seen in FIG. 3, the transfer roller means 34 establishes with the carrier web means 36 a leading angle 45 and trailing angle 46. These leading and trailing angles 45 and 46 vary as the transfer roller traverses the entire length of the master 40. The leading angle 45 and the trailing angle 46 will vary in angulation depending upon the diameter of the transfer roller, the speed of travel of the transfer roller across the carrier web means 36, the length of the master 40, the size of the transfer gap between the master 40 and the conductive receiving surface 41, and the type of toner used. The leading angle 45 can vary from between about 1° to about 10° from the front at the beginning of contact with the master 40 to about 6° to about 30° at the end of the master 40. Similarly, the trailing angle 46 can vary from between about 45° down to about 22½° at the beginning of contact with the master 40 to about 22½° to about 10° at the end of the master 40. For example, with a 1½ inch diameter transfer roller, a 24 inch long master, a transfer roller traversing speed of about 10 inches per second and about a 5 mil thick transfer gap, the leading angle 45 was about 1° at the beginning of contact with the master 40 and about 6° at the end of the master 40. The trailing angle 46 at these two locations varied between about 22½° to about 12°. As a general guide, it is not desireable to use a larger than necessary angle for the leading and trailing angles 45 and 46.

The transfer roller means 34, with the web tensioning roller means 35 and the web retention roller means 32, maintain a uniform tension on the carrier web means 36 to ensure discrete point to point transfer of the developed image on the master to the conductive receiving surface through the transfer window 37 in FIG. 3 and to avoid entrapping air and excessive non-polar insulating liquid solvent between the two surfaces. The transfer window 37 is that area on the master 40 which the diameter of the transfer roller brings into transfer proximity for discrete point transfer with the conductive receiving surface 41.

The finite gap between the two surfaces is filled with the non-polar insulating solvent across which the toner particles travel as described in copending application Ser. No. 883,797 filed July 9, 1986 and assigned to the assignee of the present invention, herein specifically incorporated by reference in pertinent part.

The electrostatic field between the master 40 and the conductive receiving surface 41 is established by the application of a charge on the conductive receiving surface 41. This charge is supplied by an independent high voltage source (not shown) through the aluminum coating on the gap spacing and charging strips 22. This electrostatic field permits the transfer of the developed image on the master 40 to the conductive receiving surface 41.

The transfer roller means 34 of FIG. 2 traverses the entire length of the master 40 by being driven along support shaft 48 by the drive motor 49, turning master screw drive 39 that moves transport roller drive nut 55. Once the transfer roller means 34 has traversed this entire length as is illustratively shown in FIG. 3, its guide roller 50 rides up the ramp plate 51, connected to web backing plate 61, into the retention groove 52 as the stop block 57 engages the stop bracket 62. This positioning of the guide roller 50 continues until the entire transfer assembly 33 is moved back to the start position seen in FIG. 1. The riding of the guide roller 50 up the ramp plate 51 causes the pivot arm 59, connected to bearing 54, to pivot about pin 60 to raise the transfer roller means 34 up and allow the carrier web means 36 to be flat against the web backing plate 61. The drive motor 49 then returns the transfer roller means 34 and the web backing plate 61 to the start position. By traversing support shaft 48 until bearing 54 abuts stop plate 58 the guide roller 50 is raised out of the retention groove 52 to separate the transfer roller means 34 from the ramp plate 51 and the web backing plate 61 to which ramp plate 51 is attached. The disengagement of the transfer roller means 34 from the retention groove 52 allows the web backing plate 61 to be driven against stop bracket 62. This is accomplished by actuating a retractable stop pin 63, mounted to the support frame 11 (not shown), in front of stop block 57 as the transfer assembly 33 is driven towards the platen 16 of FIG. 1 by the main drive screw shaft 64. After the web backing plate 61 abuts stop bracket 62, the retractable stop pin 63 is retracted to a raised position. The web backing plate 61 is now in the transfer position. The transfer roller means 34 is then in position to again traverse the carrier web means 36 to effect the electrostatic transfer from the master 40 to the conductive receiving surface 41.

The use of the terms persistent and permanent latent image with respect to the master 40 is intended to connote that the image is durable, lasting over a long period of time, as well as not changing in the high quality and resolution of its transferred image. For example, the persistent latent image can last months and, perhaps, years once exposed into the electrostatically imageable surface of the master 40, under proper storage conditions. Additionally, as many as 5,000 images have been transferred from a single master.

While the preferred structure in which the principles of the present invention have been incorporated is shown and described above, it is to be understood that the invention is not to be limited to the particular details thus presented but, in fact, widely different means may be employed in the practice of the broader aspects of this invention. For example, the master or the electrostatically developable surface can also include zinc oxide, cadmium sulfide, selenium or suitable organic photoconductors. The scope of the appended claims is intended to encompass al obvious changes in the details, materials and arrangements of parts that will occur to one of ordinary skill in the art upon a reading of this disclosure.

What is claimed is:

1. Apparatus for the electrostatic transfer of a developed image from an electrostatically developable surface to a conductive receiving surface, comprising in combination:
   (a) a support frame;
   (b) supporting means for supporting the conductive receiving surface connected to the support frame;
   (c) carrier means connected to the frame for supporting the electrostatically developable surface;
   (d) positioning means connected to the frame for positioning the carrier means relative to the supporting means to permit the electrostatic transfer to occur;
   (e) transfer means movably connected to the frame and contactable with the carrier means to move the electrostatically developable surface adjacent to, but not in contact with the conductive receiving surface to effect the electrostatic transfer of the developed image, the transfer means being reversible and traversing the carrier means a distance equal to at least the length of the electrostatically developable surface;
   (f) tensioning means for tensioning the carrier means, the tensioning means being movably connected to the frame and causing the carrier means to form a trailing angle with the conductive receiving surface as the transfer means traverses the carrier means during the electrostatic transfer; and
   (g) retention means for retaining the carrier means connected to the frame and positioned such that the transfer means is intermediate the tensioning means and the retention means causing the carrier means to form a leading angle with the conductive receiving surface as the transfer means traverses the carrier means during the electrostatic transfer.

2. The apparatus according to claim 1 wherein the retention means is further electrically charged.

3. The apparatus according to claim 2 wherein the tensioning means is electrically grounded.

4. The apparatus according to claim 3 wherein the carrier means further has a conductive surface adjacent the master.

5. The apparatus according to claim 4 wherein the carrier means further has the conductive surface connected to a non-conductive substrate.

6. The apparatus according to claim 5 wherein the non-conductive substrate further is flexible.

7. The apparatus according to claim 6 wherein the carrier means is further a generally rectangular and longitudinally extending web between the tensioning means and the retention means.

8. The apparatus according to claim 7 wherein the conductive surface of the carrier means further comprises a coating of a silver-containing compound.

9. The apparatus according to claim 7 wherein the electrostatically developable surface further comprises a multilayer sheet having a first non-conductive layer adjacent the carrier means, an intermediate conductive layer and a third photosensitive material layer containing a developable persistent latent image.

10. The apparatus according to claim 5 wherein the leading angle increases as the transfer means traverses from the tensioning means toward the retention means.

11. The apparatus according to claim 10 wherein the leading angle varies between about 1° to about 30°.

12. The apparatus according to claim 10 wherein the trailing angle decreases as the transfer means traverses from the tensioning means to the retention means.

13. The apparatus according to claim 11 wherein the trailing angle varies from about 10° to about 45°.

14. The apparatus according to claim 5 wherein the transfer means is a rotatable roller.

15. The apparatus according to claim 14 wherein the tensioning means is a spring loaded roller.

16. The apparatus according to claim 15 wherein the retention means is a stationary roller.

17. The apparatus according to claim 1 wherein the retention means is electrically grounded.

18. The apparatus according to claim 2 wherein the tensioning means is electrically charged.

19. The apparatus according to claim 6 wherein the flexible nonconductive substrate is polyethylene terephthalate.

20. Apparatus for the electrostatic transfer of a developed image from an electrostatically developable surface supported by carrier means to a conductive receiving surface, the improvement comprising in combination:

(a) transfer means contactable with the carrier means to move the electrostatically developable surface adjacent to, but not in contact with the conductive receiving surface to effect the electrostatic transfer of the developed image, the transfer means being reversible and traversing the carrier means a distance equal to at least the length of the electrostatically developable surface;

(b) tensioning means for tensioning the carrier means causing the carrier means to form a trailing angle with the conductive receiving surface as the transfer means traverses the carrier means during the electrostatic transfer; and (c) retention means for retaining the carrier means and positioned such that the transfer means is intermediate the tensioning means and the retention means causing the carrier means to form a leading angle with the conductive receiving surface as the transfer means traverses the carrier means during the electrostatic transfer.

* * * * *